US006130264A

United States Patent [19]
Cercone et al.

[11] Patent Number: 6,130,264
[45] Date of Patent: Oct. 10, 2000

[54] SYNTHETIC SPONGE AND SURGICAL SPEAR COMPRISING SYNTHETIC SPONGE

[75] Inventors: Ronald J. Cercone, East Lyme, Conn.; F. Barry Bays, Jacksonville, Fla.

[73] Assignee: Xomed Surgical Products, Inc., Jacksonville, Fla.

[21] Appl. No.: 09/025,474

[22] Filed: Feb. 18, 1998

Related U.S. Application Data

[63] Continuation-in-part of application No. 08/850,772, May 2, 1997, which is a continuation-in-part of application No. 08/780,895, Jan. 9, 1997, Pat. No. 6,027,573, which is a continuation-in-part of application No. 08/319,005, Oct. 6, 1994, abandoned.

[51] Int. Cl.$^7$ .................................. A61F 13/15; C08J 9/00
[52] U.S. Cl. ............................. 521/50; 604/378; 604/369
[58] Field of Search .................................. 424/404, 405; 604/369, 378; 521/50

[56] References Cited

U.S. PATENT DOCUMENTS

| | | | |
|---|---|---|---|
| 1,002,842 | 9/1911 | Harriss | 528/176 |
| 1,002,913 | 9/1911 | Harriss | 521/50 |
| 1,094,361 | 4/1914 | Blevney | 521/50 |
| 1,775,186 | 9/1930 | Bartling | 521/50 |
| 2,053,604 | 9/1936 | Dullinger | 521/50 |
| 2,485,428 | 10/1949 | Bleier et al. | 521/50 |
| 2,609,347 | 9/1952 | Wilson | 521/50 |
| 2,932,859 | 4/1960 | Rockoff | 521/50 |
| 3,566,871 | 3/1971 | Richter et al. | 521/50 |
| 3,837,950 | 9/1974 | Reimels | 521/50 |
| 3,858,329 | 1/1975 | Koide et al. | 521/50 |
| 3,915,671 | 10/1975 | Kagawa | 521/50 |
| 4,098,728 | 7/1978 | Rosenblatt | 521/141 |
| 4,566,911 | 1/1986 | Tomita et al. | 134/6 |
| 4,807,339 | 2/1989 | Hayashi | 604/369 |
| 4,925,453 | 5/1990 | Kannankeril | 604/369 |
| 5,009,652 | 4/1991 | Morgan et al. | 604/369 |
| 5,071,648 | 12/1991 | Rosenblatt | 424/78.06 |
| 5,387,206 | 2/1995 | Valentine et al. | 604/358 |
| 5,414,914 | 5/1995 | Suzuki et al. | 604/369 |
| 5,466,231 | 11/1995 | Cercone et al. | 604/369 |
| 5,469,864 | 11/1995 | Rosenblatt | 128/849 |
| 5,503,848 | 4/1996 | Perbellini et al. | 424/488 |
| 5,524,642 | 6/1996 | Rosenblatt | 128/849 |
| 5,556,391 | 9/1996 | Cercone et al. | 604/369 |

FOREIGN PATENT DOCUMENTS

| | | |
|---|---|---|
| 322878 | 10/1902 | France . |
| 1035021 | 7/1958 | Germany . |
| 13301 | of 1885 | United Kingdom . |

*Primary Examiner*—Terressa M. Boykin

[57] ABSTRACT

A synthetic sponge having a high density is rinsed while changing the hydrostatic pressure of rinsing solution in pore spaces of the sponge to remove chemical residue and particulate matter more completely. The hydrostatic pressure can be changed by varying fluid supply pressure or varying centrifugal force. A rinsing apparatus includes a rotatable container and a fluid supply for supplying rinsing solution to sponge material in the container.

6 Claims, 1 Drawing Sheet

SYNTHETIC SPONGE AND SURGICAL SPEAR COMPRISING SYNTHETIC SPONGE

RELATED APPLICATION DATA

This application is a continuation-in-part of application Ser. No. 08/850,772 which is a continuation-in-part of application Ser. No. 08/780,895 which is a continuation-in-part of application Ser. No. 08/319,005 filed Oct. 6, 1994 now abandoned, the disclosures of which are incorporated herein by reference.

BACKGROUND OF THE INVENTION

1. Field of the Invention

The present invention relates to high density synthetic sponges, such as polyvinyl alcohol sponges. More specifically, the invention is high density synthetic sponge and a method and apparatus for rinsing a high density synthetic sponge which reduces processing residue and particulate matter to render the sponge biocompatible.

2. Description of the Related Art

The use of synthetic sponges, such as polyvinyl alcohol (or polyvinyl acetal) sponges, is well-known. For example, synthetic sponges have been used as cleaning rollers for cleaning semiconductors or the like. Also, synthetic sponges have many medical applications. For example, synthetic sponges are used as bandages, sanitary napkins, diagnostic swabs and general surgical sponges. Also, specialty surgical sponges have been developed for use in orthopedic, vascular, plastic, eye, ear, nose, throat, and other surgical procedures. Polyvinyl alcohol sponges are used in many surgical applications. For example, surgical "spears" or "points" are small triangular sponges used during ophthalmic or other surgical procedures to absorb small amounts of liquid. Sometimes, the triangular sponges are mounted on a handle to facilitate manipulation. Ordinarily, surgical spears are made of cellulose sponge material or polyvinyl alcohol sponge material.

Conventionally, pores are formed in synthetic sponges by pore forming chemical additives such as starch and sulfate mixtures, or by injecting gas into solution during the chemical reaction used to form the sponge. In surgical applications, the sponge must be biocompatible, i.e. free of processing residue and particulate matter. Therefore, the sponge is subjected to a series of rinsing steps to remove reactant chemical residue and a particulate matter. One type of sponge currently used in surgical applications, is a polyvinyl alcohol sponge sold as the MEROCEL sponge manufactured by MEROCEL Scientific Products. The density of the MEROCEL sponge, when dry, is generally in the range of 0.70 $g/in^3$ to 1.60 grams/$in^3$. This range of densities has proven useful for many applications including sinus packing, otic products, and ophthalmic products, such as spears. However, in certain applications, it is desirable to use a synthetic sponge having a relatively high rigidity, and thus a higher density, to facilitate moving or holding tissue with the sponge.

Another available sponge is a fine grade cellulose sponge sold under the trade name WECKCEL. Cellulose sponges are absorbent and relatively rigid but have a high amount of particulate matter and thus can leave debris at the operative sight. Of course, it is desirable to form synthetic sponge material having a relatively high rigidity and a low amount of a particulate matter. However, a high rigidity necessarily requires a high density and thus presents processing problems. Specifically, when forming sponges of a relatively high density, the pores in the sponge must be relatively small. When a sponge with small pores is formed, it is a very difficult to rinse processing chemical residue and particulate matter from the pore space because rinsing solution does not readily enter and leave the small pore spaces. Therefore, it is desirable to obtain a synthetic sponge, such as a polyvinyl alcohol sponge, having a relatively high density, above 2 grams per cubic inch in a dry state for example, and also having very low chemical residue and particulate matter. Also, it is desirable to obtain a synthetic sponge having an improved surface, i.e. smoother, texture to avoid damage to sensitive tissue, such as ophthalmic tissue, during use.

SUMMARY OF THE INVENTION

It is an object of the invention to minimize chemical residue in a high density synthetic sponge.

It is another object of the invention to minimize particulate matter in a high density synthetic sponge.

It is another object of the invention to increase the effectiveness of a rinsing process in manufacturing a synthetic sponge.

It is another object of the invention to manufacture high density synthetic sponges that are biocompatible.

It is another object of the invention to improve the surface texture of a synthetic sponge.

It is another object of the invention to manufacture surgical spears of a synthetic sponge that have adequate rigidity to manipulate tissue.

It is a final object of the invention to rinse a synthetic sponge immediately after formation and prior to cutting the synthetic sponge.

To achieve these objects, a first aspect of the invention is a synthetic sponge in which pore size and volume are controlled to produce a density that provides both a rigid and absorbent sponge. After the sponge is cured, a rinsing solution is introduced into the sponge and hydrostatic pressure in the rinsing solution is varied to expand the pores of the sponge and facilitate rinsing of the sponge. The hydrostatic pressure can be alternately applied to expand and relax the pores to effectively pump the rinsing solution into and out of the pores. The hydrostatic pressure can be varied through centrifugal force or through fluid pressure. The rinsing solution can be an aqueous solution, a solvent, or any other appropriate solution.

A second aspect of the invention is a method of rinsing a synthetic sponge including the steps of, introducing a rinsing solution into pores of the sponge, and varying the hydrostatic pressure of the rinsing solution to expand and relax the pores of the sponge, and removing the rinsing solution from the pores.

A third aspect of the invention is an apparatus for rinsing a synthetic sponge including a container for holding a cured synthetic sponge, fluid supplying conduit for introducing rinsing solution to the sponge, and a mechanism for varying the hydrostatic pressure of the solution in the sponge.

BRIEF DESCRIPTION OF THE DRAWING

The invention will be described through preferred embodiments and the drawing in which.

DETAILED DESCRIPTION OF THE PREFERRED EMBODIMENTS

Figure 1:
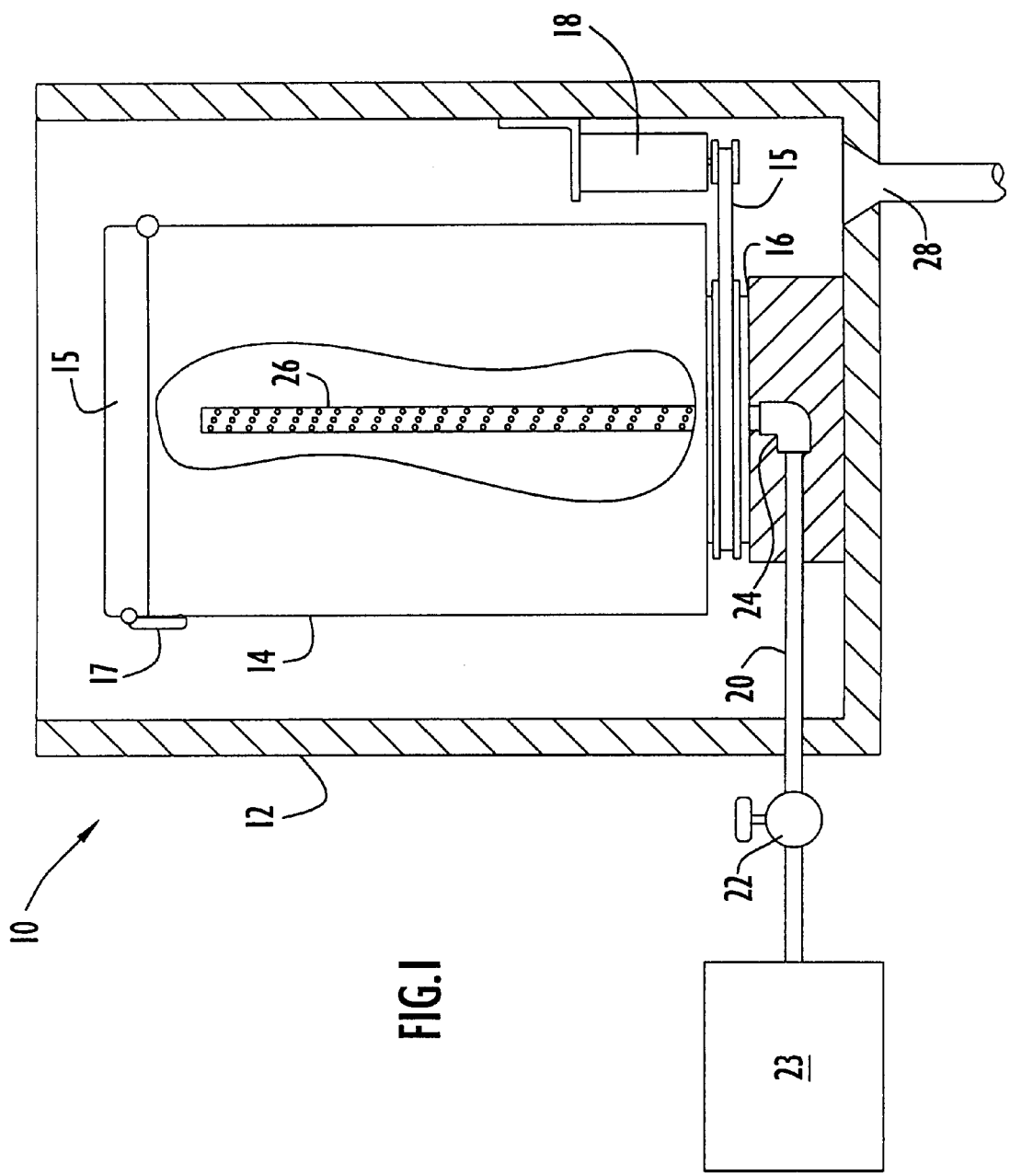
FIG. 1 is a side view, in partial section and partially cut away, of a rinsing apparatus according to the invention.

A synthetic sponge can be formed through known methods. For example, U.S. Pat. No. 4,098,728, the disclosure of which is incorporated herein, discloses a method of making a polyvinyl alcohol sponge including controlling the pore size of the sponge to achieve desired densities. Previously, sponges having a density greater than about 1.60 grams/in$^3$ were not practical because of difficulties in rinsing sponges having small pore sizes. However, the apparatus and method of the invention permit thorough rinsing of high density synthetic sponges. A rinsing apparatus according to the invention is illustrated in FIG. 1. Rinsing apparatus 10 includes base or housing 12, container 14, motor 18, and solution supplying conduit 20. Container 14 is rotatably mounted in housing 12 through bearing 16. Motor 18 is mounted on an inside wall of housing 12 and is operatively coupled to container 14, via belt 15, to rotate container 14. Solution supply conduit 20 is coupled to an interior of container 14 through rotatable coupling 24 to permit rinsing solution to be introduced into container 14.

Solution supply conduit 20 includes valve 22 and is coupled to rinsing solution supply 23 which includes a pump or the like for increasing pressure in rinsing solution stored therein. Perforated core 26 extends from rotatable coupling 24 to an interior of container 14. Therefore, when valve 22 is open, rinsing solution will flow through solution supply conduit 20, rotatable coupling 24, and perforated core 26 into container 14. Valve 22 can be any appropriate type of fluid valve and can have fully open, fully closed, and intermediate states, and can be coupled to a control system through known actuators, such as solenoids or the like, to permit manual control of valve 22 or automatic control of valve 22 in a predetermined manner. Similarly, motor 18 can be coupled to a control system to permit manual control of motor 18 or automatic control of motor 18 in concert with valve 22. Container 14 includes hinged lid 15 and latch 17. Drain 28 is provided in a lower portion of housing 12. Operation of rinsing apparatus 10 will be described below in connection with a synthetic sponge rinsing process.

Once a synthetic sponge material is formed in a known manner, the synthetic sponge material is placed in container 14. Note that the synthetic sponge can be formed to have a high density previously not practical because of the known difficulties in rinsing sponges having small pore spaces. Preferably, the synthetic sponge material is shaped, by using a mold or the like in the forming process, to conform substantially to the shape of container 14 and to permit perforated core 26 to extend therethrough. The synthetic sponge material can be a polyvinyl alcohol sponge, such as the sponge material disclosed in U.S. Pat. No. 4,098,728, or any other type of sponge material which requires rinsing to remove chemical residue, particulate matter, or of the like. Of course, the sponge material can be formed in any shape and can be cut to fit in container 14. Also, container 14 can be shaped appropriately to conform to a final shape of the sponge material after a forming process to permit the sponge material to be rinsed prior to cutting. Once the sponge material is placed in container 14, the pore spaces of the sponge material are filled with a rinsing solution, such as an aqueous solution, by introducing rinsing solution through solution supply conduit 20, rotatable coupling 24, and perforated core 26. Alternatively, the sponge can be soaked in the rinsing solution, or otherwise have rinsing solution introduced into pores thereof, prior to being inserted in container 40. Lid 15 is then closed and motor 18 is actuated to rotate container at a desired speed, for example 500 revolutions per minute for a container 14 having a diameter of 18 inches or less. This speed can be reduced for larger container sizes and increased for smaller container sizes. Simultaneously, valve 22 is controlled in a desired manner to introduce rinsing solution to central portions of the sponge. Valve 22 can be controlled to be placed in alternately open and closed states to create pulses of pressurized rinsing solution in the sponge. Also, motor 18 can be alternately actuated to create pulses of pressure in the rinsing solution in the pores of the sponge through varying centrifugal force.

The alternating states of valve 22 and/or motor 18 varies the hydrostatic pressure of solution in the pores of the sponge material to create pulses of pressure in pores of the sponge material and thereby alternately enlarge and relax the pores effectively pump rinsing solution into and out of the individual pores. The duration of the pulses can be of any length, a few seconds to 10 minutes for example, and the pulses can be of any pressure value, depending on the average pore size of the sponge, the size of the sponge, the total rinsing time, the required purity of the sponge, and other factors. The centrifugal force generated by rotation of container 14 will cause rinsing solution to move radially outward through the sponge material. Container 14 can be permeable, can have perforations formed therein or can be constructed otherwise to permit rinsing solution to exit container 14 and to pass into drain 28.

The pumping action described above allows rinsing solution to enter and be flushed from pores of the sponge material, even when the average pore diameter is very small. Therefore, pore formers, such as starch and sulfate mixtures or gas, are readily rinsed from the sponge. Also, any reactants used during the sponge forming process, or any particulate matter created during the sponge forming process, is readily rinsed from the pores of the sponge.

The invention permits a high density, and thus rigid, synthetic sponge to be manufactured without chemical residue or particulate contamination. For example a synthetic sponge having a density of greater than 1.5 g/in$^3$, for example, 1.5–3.5 g/in$^3$, preferably 2.0 g/in$^3$ or greater can be manufactured for medical applications with residual metals of less 5 ppm for each metal. Such a sponge is well suited for use in ophthalmic, otic, and other surgical procedures, as spears or others instruments. A surgical spear manufactured from the sponge of the invention can be used to contact and move tissue flaps because of increased rigidity, smooth surface texture, and increased cleanliness, i.e. purity. The sponge material resulting from the invention is particularly well suited for use in "Lasik" surgical procedures of the eye and other areas or for cleaning semiconductor surfaces because rigidity and cleanliness of the sponge is crucial in such procedures. The invention can be applied to any type of sponge and finds particular applications in a rinsing synthetic sponges, such as polyvinyl alcohol sponges.

The hydrostatic pressure of the rinsing solution can be generated through centrifugal force, pressure in the rinsing solution, or any other means. The duration and magnitude of the pulses and pressure in the rinsing solution can be of any value. Further, the hydrostatic pressure can remain substantially constant throughout the rinsing process. The rinsing solution can be introduced into the sponge through soaking, spaying, or any other means in addition to, or as an alternative to, the disclosed conduit and core. The core can be eliminated and the rinsing solution can be introduced directly in any portion of the container. The container can be of any appropriate size or shape. Rinsing solution can be drained from the container through perforations in the container walls or from any appropriate apertures or permeable sections in the container. Any type of rinsing solution can be used with the invention. For example, superfiltered deionized water can be used.

What is claimed:

1. A synthetic sponge having a density of greater than or equal to 1.5 g/in$^3$ and residual metals at less than 5 ppm for each of said residual metals.

2. A synthetic sponge as recited in claim 1 wherein said density is in the range of 1.5 g/in$^3$ to 3.5 g/in$^3$, inclusive.

3. A synthetic sponge as recited in claim 2, wherein said density is in the range of 2.0 g/in$^3$ to 3.5 g/in$^3$, inclusive.

4. A surgical spear comprising a synthetic sponge having a density of greater than or equal to 1.5 g/in$^3$ and residual metals at less than 5 ppm for each of said residual metals.

5. A surgical spear as recited in claim 4, wherein said density is in the range of 1.5 g/in$^3$ to 3.5 g/in$^3$, inclusive.

6. A surgical spear as recited in claim 5, wherein said density is in the range of 2.0 g/in$^3$ to 3.5 g/in$^3$, inclusive.

* * * * *